United States Patent
Bertet et al.

(10) Patent No.: US 12,105,037 B2
(45) Date of Patent: Oct. 1, 2024

(54) METHOD FOR DETECTING SPINS BY PHOTON COUNTING

(71) Applicant: COMMISSARIAT A L'ENERGIE ATOMIQUE ET AUX ENERGIES ALTERNATIVES, Paris (FR)

(72) Inventors: Patrice Bertet, Gif sur Yvette (FR); Emmanuel Flurin, Gif sur Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 27 days.

(21) Appl. No.: 17/801,215

(22) PCT Filed: Mar. 22, 2021

(86) PCT No.: PCT/EP2021/057204
§ 371 (c)(1),
(2) Date: Aug. 19, 2022

(87) PCT Pub. No.: WO2021/191119
PCT Pub. Date: Sep. 30, 2021

(65) Prior Publication Data
US 2023/0077436 A1    Mar. 16, 2023

(30) Foreign Application Priority Data

Mar. 26, 2020  (FR) ...................... 2002976

(51) Int. Cl.
*G01V 3/00*       (2006.01)
*G01N 24/10*      (2006.01)
*G01R 29/08*      (2006.01)
*G01R 33/46*      (2006.01)

(52) U.S. Cl.
CPC .......... *G01N 24/10* (2013.01); *G01R 29/0807* (2013.01); *G01R 33/4608* (2013.01)

(58) Field of Classification Search
CPC . G01N 24/10; G01R 29/0807; G01R 33/4608
USPC ....................................................... 324/309
See application file for complete search history.

(56) References Cited

U.S. PATENT DOCUMENTS

2018/0031657 A1\*  2/2018  Takeda .................. G01R 33/448

FOREIGN PATENT DOCUMENTS

| KR | 20180112833 A | \* | 10/2018 | |
|---|---|---|---|---|
| WO | WO-2006083482 A2 | \* | 8/2006 | ........... B81B 3/0018 |
| WO | WO-2009032291 A2 | \* | 3/2009 | ......... G01R 33/4641 |
| WO | WO-2018220183 A1 | \* | 12/2018 | ............. G01N 24/08 |

OTHER PUBLICATIONS

McCoy, et al., "Nuclear spin noise at room temperature", Chemical Physics Letters, vol. 159, pp. 587-593, 1989.
(Continued)

*Primary Examiner* — Walter L Lindsay, Jr.
*Assistant Examiner* — Frederick Wenderoth
(74) *Attorney, Agent, or Firm* — BakerHostetler

(57) ABSTRACT

A method of detecting spins in a sample, includes exciting the spins of the sample by means of a radio-frequency or microwave electromagnetic pulse for flipping the spins, and detecting a noise signal produced by the return of the spins to equilibrium by means of a device for counting radio-frequency or microwave photons.

9 Claims, 4 Drawing Sheets

(56) References Cited

OTHER PUBLICATIONS

Kubo, et al., "Electron spin resonance detected by a superconducting qubit", Phys. Rev. B, vol. 86, No. 6, pp. 064514-1-064514-6, 2012.
Bienfait, et al., "Reaching the quantum limit of sensitivity in electron spin resonance", Nature Nanotechnology, vol. 11, No. 3, pp. 253-257, 2016.
Probst, et al., "Inductive detection electron-spin resonance spectroscopy with 65 spins/√Hz sensitivity", Appl. Phys. Lett. 111, 202604, 2017.
Walsh, et al., "Graphene-Based Josephson-Junction Single-Photon Detector", Physical Review Applied, vol. 8, No. 2, Aug. 2017.
Lescanne, et al., "Detecting itinerant microwave photons with engineered non-linear dissipation", arxiv:1902:05102, 2019.
Ranjan, et al., "Pulsed electron spin resonance spectroscopy in the Purcell regime", J. Mag. Res., vol. 310, 2020.

\* cited by examiner

METHOD FOR DETECTING SPINS BY PHOTON COUNTING

CROSS-REFERENCE TO RELATED APPLICATIONS

This application is a National Stage of International patent application PCT/EP2021/057204, filed on Mar. 22, 2021, which claims priority to foreign French patent application No. FR 2002976, filed on Mar. 26, 2020, the disclosures of which are incorporated by reference in their entirety.

FIELD OF THE INVENTION

The invention relates to a method for detecting spins by photon counting. It mainly, but not exclusively, applies to EPR spectroscopy (EPR standing for Electron Paramagnetic Resonance).

BACKGROUND

EPR spectroscopy exploits the ability of unpaired electrons, which are found in certain chemical species (free radicals and salts and complexes of transition metals) to absorb and re-emit the energy of electromagnetic radiation, typically microwave radiation, when they are placed in a magnetic field.

The absorption or emission spectrum of the electromagnetic radiation provides information on the chemical environment of the unpaired electron or of the nucleus, respectively.

FIG. 1 schematically illustrates an EPR-spectroscopy apparatus according to the prior art, see for example (Bienfait 2016), (Probst 2017) and (Ranjan 2020).

A sample E containing a set of N electronic spins SE is placed in a cryogenic enclosure CRY, in the magnetic field $B_0$ generated by a magnet or superconducting coil A. The strength of the magnetic field determines the resonant angular frequency $\omega_0$ of the electronic spins:

$$\omega_0 = -\gamma B_0$$

where $\gamma$ is the gyromagnetic ratio of the electron. The frequency $f_L = \omega_0/2\pi$ is called the Larmor frequency. Typically, it is located in the microwave spectral region because the gyromagnetic ratio of a free electron is equal to about 28 GHz/T.

The sample E is furthermore magnetically coupled to an electromagnetic resonator REM tuned to the Larmor frequency and modeled by a parallel LC circuit. In the case of (Bienfait 2016), (Probst 2017) and (Ranjan 2020), the resonator is a planar structure comprising two interdigital electrodes that form a capacitor and that are connected at their center by an inductive conductive line, in proximity to which line the sensitive region is located. The plane of the resonator is parallel to the magnetic field $B_0$. Other types of resonators may be used, for example conductive cavities surrounding the sample on all sides.

The coupling constant of the sample to the resonator is designated "g", and its quality factor is designated Q. Typically, the coupling constant is sufficiently high for the Purcell effect to dominate the dynamics of relaxation of the spins: $\Gamma_1 \approx \Gamma_P$ where $\Gamma_1$ is the energy relaxation rate of the spins and $\Gamma_P$ is the Purcell factor, which is given by $$\Gamma_P = 4g^2/\kappa$$

where $\kappa = \omega_0/Q$ is the rate of dissipation of energy in the resonator.

A signal generator GS applies, to the resonator REM, a sequence of microwave pulses IEX at the Larmor frequency. These so-called excitation pulses excite the spins of the sample coupled to the resonator.

The most widely used sequence of excitation pulses is the so-called "spin-echo" sequence. It comprises a first impulse so-called "$\pi/2$" pulse, which flips the spins—which are initially aligned with the magnetic field $B_0$—into a plane perpendicular thereto. The spins precess around the magnetic field $B_0$ and, on doing so, emit a first electromagnetic signal at the Larmor frequency. This signal is called the FID signal (FID standing for Free Induction Decay) because its intensity decreases exponentially due to spin decoherence, with a time constant $T_2^* = (\Gamma_2^*)^{-1}$. The decoherence rate $\Gamma_2^*$ depends on the properties of the sample and on the uniformity of the magnetic field $B_0$. After a certain time—shorter than time taken for the spins to lose their coherence $T_2 = (\Gamma_2)^{-1}$—a so-called "$\pi$" pulse is applied. This second pulse inverts the orientation of the spins and causes the emission of a second so-called echo electromagnetic signal.

The electromagnetic signals emitted by the spins are converted into an electronic response signal RS by the resonator. A gyrator G makes it possible to separate the excitation pulses from the response signal RS. In particular, it is the echo signal that is used to detect the spins.

The response signal RS is delivered, via a suitable transmission line LT (typically a coaxial cable), to an electronic detecting system SED.

For example, in the case of (Bienfait 2016), (Probst 2017) and (Ranjan 2020), the electronic detecting system comprises a Josephson parametric amplifier JPA pumped at an angular frequency $\omega_p \approx 2\omega_0$; the amplified signal is subsequently amplified by a HEMT amplifier HA, then mixed in a mixer ML with a signal SOL from a local oscillator OL at the angular frequency $\omega_0$, and the in-phase component I and quadrature component Q of the baseband signal resulting from the mixing are detected (homodyne detection).

It is possible to demonstrate—see for example (Bienfait 2016)—that, in the case where the quality factor of the resonator is limited by the coupling to the detection antenna (overdamped regime)—the amplitude of a spin-echo signal is equal to $$X_e = pN\sqrt{\Gamma_P/2\Gamma_2^*}$$

where "p" is the polarization at equilibrium of the set of spins, which depends on the temperature according to Maxwell-Boltzmann statistics, and N is the number of spins in the sample.

The noise level is given by $$\delta X = \sqrt{n}/2$$

with $n = n_{eq} + n_{amp}$ where $n_{eq}$ is the thermal noise of the microwave field, $n_{eq} = 1 + 2\langle n \rangle$ with $\langle n \rangle = 1/(e^{\hbar\omega_0/k_BT} - 1)$ expressing the average number of photons per mode at the temperature T ($k_B$: Boltzmann's constant) and $n_{amp}$ is the noise added by the amplifier. The signal-to-noise ratio of homodyne echo detection is therefore equal to $$SN_{e,h} = 2pN\sqrt{\Gamma_P/2n\Gamma_2^*}.$$

where the subscripts "e" and "h" stand for "spin echo" and "homodyne detection", respectively.

Even in the ideal case where p=1 (full polarization of the sample) and n=1 (detector at the quantum noise limit and very low temperature), to obtain a signal-to-noise ratio equal to 1 it is therefore necessary for the number of spins in the sample to satisfy $N \geq \sqrt{2\Gamma_2^*/\Gamma_P}$.

However, in general $\Gamma_2^*/\Gamma_P \gg 1$, and therefore $N \gg 1$.

The authors of (Probst 2017) obtained, by means of an apparatus of the type shown in FIG. 1, a detection sensitivity of 65 spins/$\sqrt{Hz}$ and an acquisition rate (limited by $\Gamma_P$) of 10 Hz, which allowed them to detect the signal generated by a sample containing only 200 spins. To do this, they worked at a temperature of 10 mK, such that and p≈1 and $n_{eq}$≈1, maximized the quality factor of the electromagnetic resonator and its coupling constant to the sample and used an amplifier at the quantum noise limit, so that $n_{amp}$≈0.

Other techniques for detecting spin have been used in the prior art, but they have not allowed such high sensitivities to be achieved.

In particular, other excitation sequences may be used. For example, it is possible to use only a "π/2" pulse and to detect the FID signal directly, without inducing an echo.

In (Kubo 2012), an FID signal was detected not by conventional electronic techniques, such as homodyne or heterodyne detection, but by counting microwave photons by means of a transmon, which is a type of superconducting qubit (a qubit being a two-level quantum system). In this method, both the sample and the detecting qubit are arranged in a microwave cavity the resonant frequency of which must be modified dynamically in order to allow the electron spins to first be excited with a "π/2" pulse, then the FID signal to be detected by the qubit. This technique is complex to implement and has only allowed a sensitivity of the order of $10^5$ spins/$\sqrt{Hz}$ to be achieved, several orders of magnitude worse than the—earlier—result of (Probst 2017).

The use of a "π" pulse alone induces the emission of an incoherent signal ("noise") caused by the return of spins to equilibrium. Such a signal has been observed—in Nuclear Magnetic Resonance—by (McCoy 1989), but considered of no practical interest due to its very low sensitivity.

SUMMARY OF THE INVENTION

The invention aims to improve the sensitivity of the detection of spins, and in particular to make possible measurements on samples containing a very low number of spins, for example 10 or fewer, or even just one.

According to the invention, this aim is achieved by virtue of detection, by means of a counter of radio-frequency or microwave photons, of the incoherent signal emitted by the spins excited by a spin-inverting pulse ("π" pulse). One subject of the invention is therefore a spin-detection method comprising the following steps:
a) placing a sample containing spins in a static magnetic field;
b) magnetically coupling the sample to an electromagnetic resonator having a resonant frequency $\omega_0/2\pi$ equal to the Larmor frequency of the spins in the static magnetic field, the coupling constant and the quality factor of the resonator being sufficiently high for the coupling to the resonator to dominate the dynamics of relaxation of the spins;
c) exciting the spins of the sample by means of a radio-frequency or microwave electromagnetic pulse at said Larmor frequency; and
d) detecting an electromagnetic signal emitted by the spins of the sample in a mode of the electromagnetic resonator in response to said pulse by means of a device for counting radio-frequency or microwave photons;
characterized in that the radio-frequency or microwave electromagnetic pulse at the Larmor frequency is a spin-flipping pulse, whereby the detected signal is a noise signal produced by the return of the spins to equilibrium.

By "radio-frequency", what is meant is frequencies comprised between 1 MHz and 1 GHz and by "microwave" what is meant is frequencies comprised between 1 GHz and 100 GHz.

BRIEF DESCRIPTION OF THE DRAWINGS

The appended drawings illustrate the invention.

DETAILED DESCRIPTION

Figure 1:
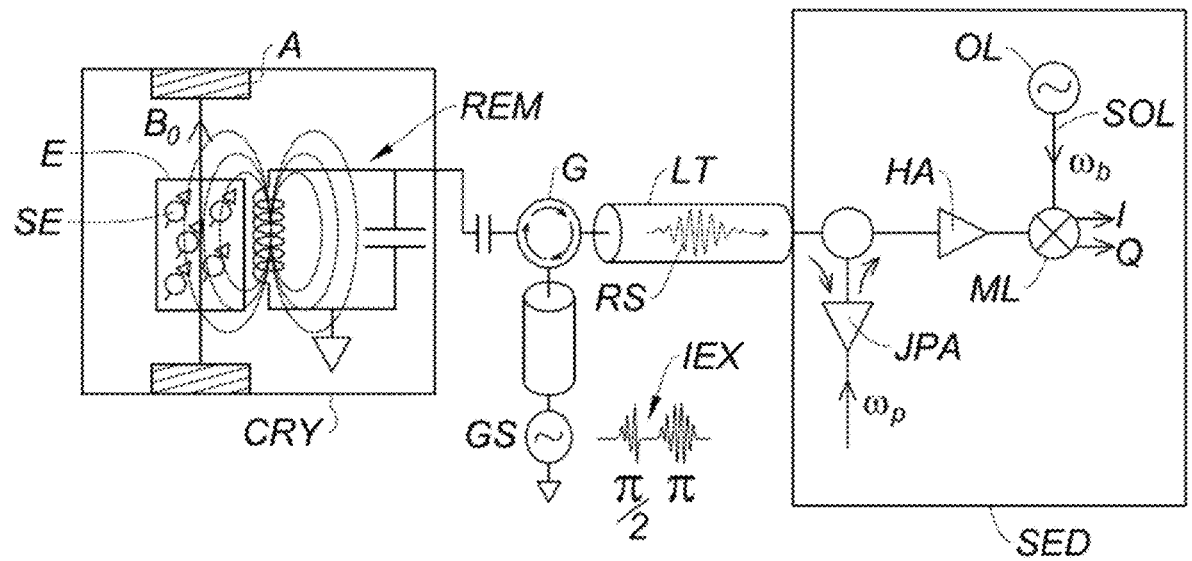
FIG. 1, which has already been described, schematically illustrates an EPR-spectroscopy apparatus according to the prior art.
Figure 2:
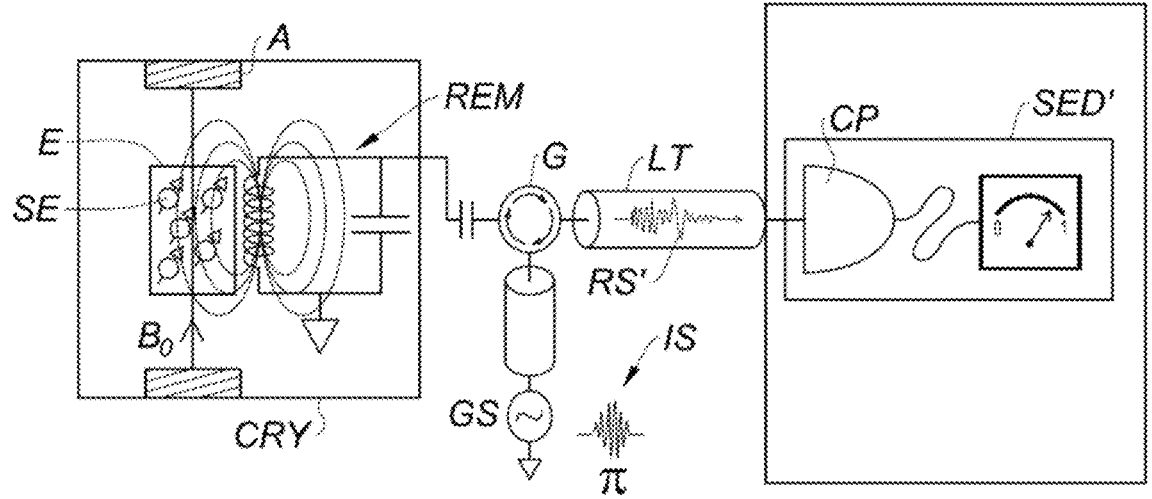
FIG. 2 schematically illustrates an EPR-spectroscopy apparatus for implementing a method according to the invention.

The method of the invention may be implemented by means of an apparatus of the type illustrated in FIG. 2, which differs from that of FIG. 1 essentially in that its electronic system SED' for detecting the microwave signal emitted by the spins of the sample E is based on a device CP for counting microwave photons.

Figure 3:
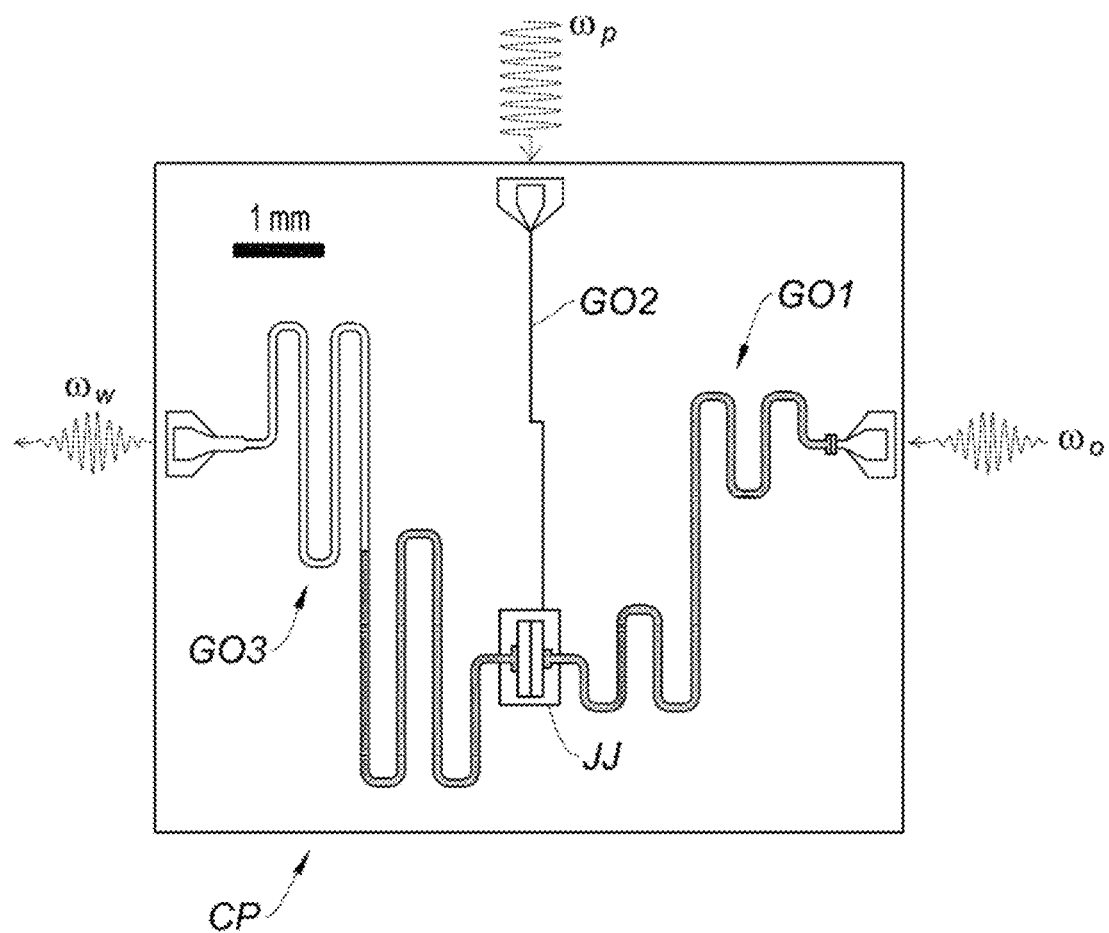
FIG. 3 illustrates the structure of a counter of microwave photons able to be used in the apparatus of FIG. 2.

The photon-counting device CP may be a superconducting qubit, in particular a transmon, such as described in (Lescanne 2019) and illustrated in FIG. 3. This device comprises a Josephson junction JJ in transmon configuration connected to three lengths of planar waveguide. The first length of waveguide GO1 forms a half-wavelength (λ/2) resonator resonant at the angular frequency $\omega_0$ of the photons to be detected. The second length of waveguide GO2 is intended to direct, to the Josephson junction, a so-called pump signal, at an angular frequency $\omega_p$. The third length of waveguide GO3 forms a pair of half-wavelength (λ/2) resonators resonant at an angular frequency $\omega_w$, referred to as the "waste" angular frequency, and is coupled, via a so-called "Purcell" band-pass filter, to a cold environment (on the scale of millikelvin) having a characteristic impedance of 50 ohm. The Josephson junction in transmon configuration behaves as a two-level system. When it is in its ground state, the simultaneous arrival of a photon at the angular frequency $\omega_0$ and of a pump photon at the angular frequency $\omega_P$ causes the Josephson junction to transition to its excited state, the remaining energy being dissipated to the cold environment in the form of a photon at the angular frequency $\omega_w$. The state of the transmon is read by probing one of the two resonators to which the qubit is coupled (the waste mode for example) with a microwave pulse at its resonant frequency; because of the dispersive coupling to the qubit, the phase of the pulse reflected by the resonator allows the state of the qubit and therefore whether or not a photon is present to be deduced. The device is reset by injecting a photon of angular frequency $\omega_w$ into GO3, said photon combining with a pump photon in the Josephson junction to return the latter to its ground state, excess energy being removed via a photon at the wavelength $\omega_0$.

Other types of devices allow microwave or even radio-frequency photons to be counted. For example, (Walsh 2017) proposes a bolometer-type detector that uses a Josephson junction to detect heating of a graphene sheet induced by a single photon.

Furthermore, the electronic system GS for generating signals of the apparatus of FIG. 2 is configured to generate, instead of spin-echo sequences, single inverting or "π" pulses IS.

More generally, inverting pulses, which flip the spins by π rad, may be replaced by pulses that flip by a non-zero angle φ that may be less than or equal to π rad ("flipping" pulses). The case where φ=π rad (inversion) is preferred because it maximizes the intensity of the signal emitted by the spins.

The spins of the sample, which are excited by an inverting or flipping pulse, return to equilibrium by spontaneously, and therefore incoherently, emitting photons at the Larmor frequency, forming what is called "spin noise". The spontaneous emission is highly accelerated by the Purcell effect, and hence almost all of these photons are emitted in a mode of the electromagnetic resonator and are coupled to the transmission line LT, which guides their propagation to the photon-counting device CP. In FIG. 2, the reference RS' designates the response signal propagating along the transmission line LT. It will be noted that, contrary to the spin-echo signal RS of FIG. 1, it consists entirely of noise.

Whereas, as discussed above with reference to (McCoy 1989), the detection of spin noise via conventional electronic techniques (homodyne or heterodyne demodulation) is not very sensitive, the present inventors have discovered that, unexpectedly, detection of spin noise by photon counting makes it possible to achieve a higher sensitivity than the prior art (homodyne detection of a spin-echo signal).

This may be demonstrated in the following way.

If N is the number of spins in the sample and p (comprised between 0 and 1, and in practice close to 1) is the polarization, the number of excited spins is equal to pN. These spins relax with a time constant $T_1=(\Gamma_1)^{-1}$. It is possible to consider that all the spins will have relaxed at the end of an acquisition window sufficiently long with respect to $T_1$—for example longer than or equal to $5T_1$ even $10T_1$. The probability that a spin relaxes by emitting a photon in a mode of the electromagnetic resonator is equal to $p_1=\Gamma_P/\Gamma_1$. The photon counter is considered to have a bandwidth equal to $\Gamma_2^*$, which allows it, in principle, to collect all the photons emitted by the spins, and a quantum efficiency η. The number of photons detected by the counter is therefore equal to $\eta p N \Gamma_P/\Gamma_1$.

The number of noise photons (i.e. of photons not originating from spins) is given by $\langle n \rangle \Gamma_2^*/\Gamma_1 + \alpha\Gamma_1^{-1}$ where, as explained above, $\langle n \rangle =1/(e^{\hbar\omega_0/k_B T}-1)$ is the average number of photons per mode at the temperature T and α is the dark count rate, i.e. the count rate in the absence of photons.

The noise level corresponds to the standard deviation of the number of noise photons detected, which, assuming that the dark photons have a Poisson distribution, is the square root thereof.

Another source of noise results from the fact that the number of detected photons originating from spins itself varies, because the number of photons emitted by the spins is a random variable of standard deviation $\sqrt{p_1(1-p_1)N}$.

Furthermore, since detection efficiency is finite, the number of photons detected is also a random variable, of standard deviation $\sqrt{\eta(1-\eta)N}$.

In total, the standard deviation of the detection noise is therefore equal to $$\sqrt{\langle n \rangle \Gamma_2^*/\Gamma_1 + \alpha\Gamma_1^{-1} + [p_1(1-p_1) + \eta(1-\eta)]N}.$$

The signal-to-noise ratio of this method of incoherent detection by photon counting is therefore equal to:

$$SN_{i,CP} = \eta p N p_1 / \sqrt{\langle n \rangle \Gamma_2^*/\Gamma_1 + \alpha\Gamma_1^{-1} + [p_1(1-p_1) + \eta(1-\eta)]N}$$

where the subscript "i" stands for "incoherent" (and, therefore, spin noise) and "CP" stands for detection by photon counting. Herein lies the fundamental difference with the conventional method of homodyne detection. Whereas signal-to-noise ratio in homodyne detection is intrinsically limited by vacuum fluctuations that mean that with photon counting there is a parameter regime in which the signal-to-noise ratio may be arbitrarily high.

Specifically, in the ultimate limit where p=1 (maximum spin polarization), $p_1$=1 (spins relax dominantly via the Purcell effect) and $\langle n \rangle$ ~0, this last condition corresponding to $$T \ll \frac{\hbar\omega_0}{k_B},$$

the following is obtained:

$$SN_{i,CP} = \eta N/\sqrt{\alpha\Gamma_P^{-1} + \eta(1-\eta)N},$$

whereas it will be recalled that:

$$SN_{e,h} = 2N\sqrt{\Gamma_P/2\Gamma_2^*}$$

in homodyne detection. However, there is no theoretical limit on the value that the efficiency of the detector or the dark count rate may reach, i.e. η may be as close to 1 as desired, and $\alpha(\Gamma_P)^{-1}$ may be as low as necessary.

$SN_{i,CP}$ may therefore be arbitrarily high, even if N=1 and $\Gamma_P/2\Gamma_2^* \gg 1$, provided that the efficiency of the detector is high, and that the dark count rate is low enough.

It is interesting to also calculate, for the purposes of comparison, the signal-to-noise ratio achievable by homodyne detection of spin noise and by counting the photons of a spin-echo signal.

In the case of homodyne detection of spin noise, the total power emitted by the spins is given by the number of photons emitted in the detection window, which is equal to $pN\Gamma_P/\Gamma_1$ in a bandwidth given by $\Gamma_2^*$. The corresponding noise power is given by $n\Gamma_2^*/\Gamma_1$. The standard deviation is $\sqrt{n\Gamma_2^*/\Gamma_2}$.

The signal-to-noise ratio of this method of incoherent homodyne detection is therefore equal to:

$$SN_{i,h} = pN\Gamma_P/\sqrt{n\Gamma_1\Gamma_2^*}.$$

It may be seen that the ratio $$SN_{e,h}/SN_{i,h} = 2\sqrt{\Gamma_1/\Gamma_P}$$

is always greater than 2, and even very much greater than 2 in situations where $\Gamma_1 \gg \Gamma_P$. Hence, this method is less suited to detection of low numbers of spins than the method of the invention.

In the case of counting the photons of a spin-echo signal, the number of photons detected is given by $\eta p^2 N^2(\Gamma_P/2\Gamma_2^*)$, which is the square of the amplitude of the signal multiplied by the efficiency η of the detector.

The duration of the echo is $(\Gamma_2^*)^{-1}$, and hence the number of dark counts is $\alpha(\Gamma_2^*)^{-1}$. The noise level corresponds to the standard deviation, i.e. to the square root, of this number of counts. Furthermore, it is necessary to take into account the shot noise due to the echo itself, which is a coherent state of the field and therefore has a standard deviation given by $pN\sqrt{(1+\langle n \rangle)\eta(\Gamma_P/2\Gamma_2^*)}$.

The signal-to-noise ratio of the detection of a spin-echo signal by photon counting is therefore equal to $$SN_{e,CP} = \eta p^2 N^2 (\Gamma_P/2\Gamma_2^*) / \sqrt{\alpha(\Gamma_2^*)^{-1} + \eta p^2 N^2 (1+\langle n \rangle)(\Gamma_P/2\Gamma_2^*)}.$$

In the "ultimate" limit where $p=1$, $\Gamma_1 \approx \Gamma_P$ and $\langle n \rangle \approx 0$, the following is obtained:

$$SN_{e,CP} = \frac{\eta N^2 \left(\frac{\Gamma_P}{2\Gamma_2^*}\right)}{\sqrt{\alpha(\Gamma_2^*)^{-1} + \eta N^2 \left(\frac{\Gamma_P}{2\Gamma_2^*}\right)}} < SN_{e,h} = 2N\sqrt{\Gamma_P/2\Gamma_2^*}$$

So there is in principle no advantage in terms of signal-to-noise ratio in detecting an echo by photon counting rather than by coherent homodyne detection.

The ratio $SN_{i,CP}/SN_{e,CP}$ is equal to $$SN_{i,CPM}/SN_{e,CPM} = (1/N)\sqrt{\Gamma_2^*/\Gamma_P}.$$

It may therefore be seen that the method of the invention is advantageous with respect to the detection by counting an echo signal when the number of spins of the sample is less than $$N_c = \sqrt{\Gamma_2^*/\Gamma_P}$$

If $N > N_c$, the method of detection by spin-echo and photon counting may therefore be more sensitive than the method according to the invention. However, in this case it will generally be preferable to employ conventional homodyne detection.

In conclusion, it may be seen that none of these techniques allows a signal-to-noise ratio as high as that provided by the invention to be achieved in the case of samples It will be clear from the foregoing that the method of the invention is particularly advantageous when the number N of spins of the sample is of the order of or less than $\sqrt{2\Gamma_2^*/\Gamma_P}$ and when $\Gamma_2^*/\Gamma_P \gg 1$, and provided that $$T_0 \leq \frac{\hbar\omega_0}{k_B}.$$

Figure 4A:
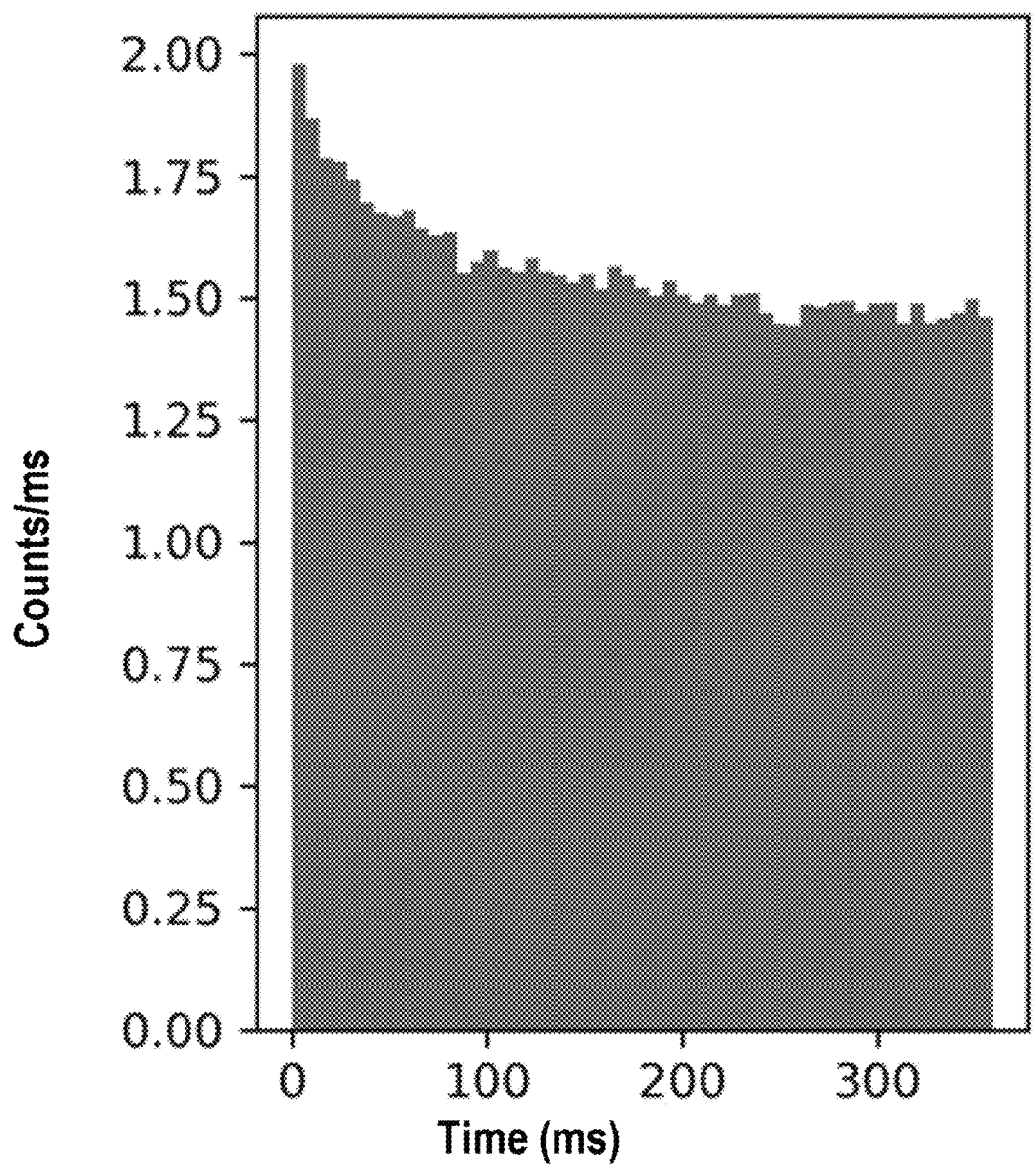
FIG. 4a and
FIG. 4b illustrate experimental results.

The technical result of the invention has been validated experimentally by detecting the microwave signal emitted by a set of $N \cong 200$ donors (bismuth atoms) in silicon coupled to a resonator at the frequency $\omega_0$ by a device for counting microwave photons that was similar to the one described in the reference (Lescanne 2019) and that was tuned to the frequency $\omega_0$. In this experiment, $\Gamma_2^* \cong 10^5 s^{-1}$, $\Gamma_P \cong 10 s^{-1}$, and $\Gamma_1 = \Gamma_P$. The signal of the spins was detected according to the two modalities envisioned in this patent. FIG. 4a illustrates the results of an experiment in which spin-noise photons were counted, with a counter such that $\eta \cong 0.2$ and $\alpha = 1.5$ ms$^{-1}$. It may be seen that the number of photons detected per unit time just after a n pulse applied to the spins decreased exponentially with a time constant $\Gamma_P^{-1} = 100$ ms, before reaching a constant value corresponding to the dark count rate. It was a question of spontaneous emission by the spins via the Purcell effect. The total number of counts detected during each sequence, read from the graph of FIG. 4a by subtracting the baseline corresponding to the dark count (about 1.5 counts/ms) and integrating the number of remaining counts, is about 50, which is close to the expected value $\eta N$.

Figure 4B:
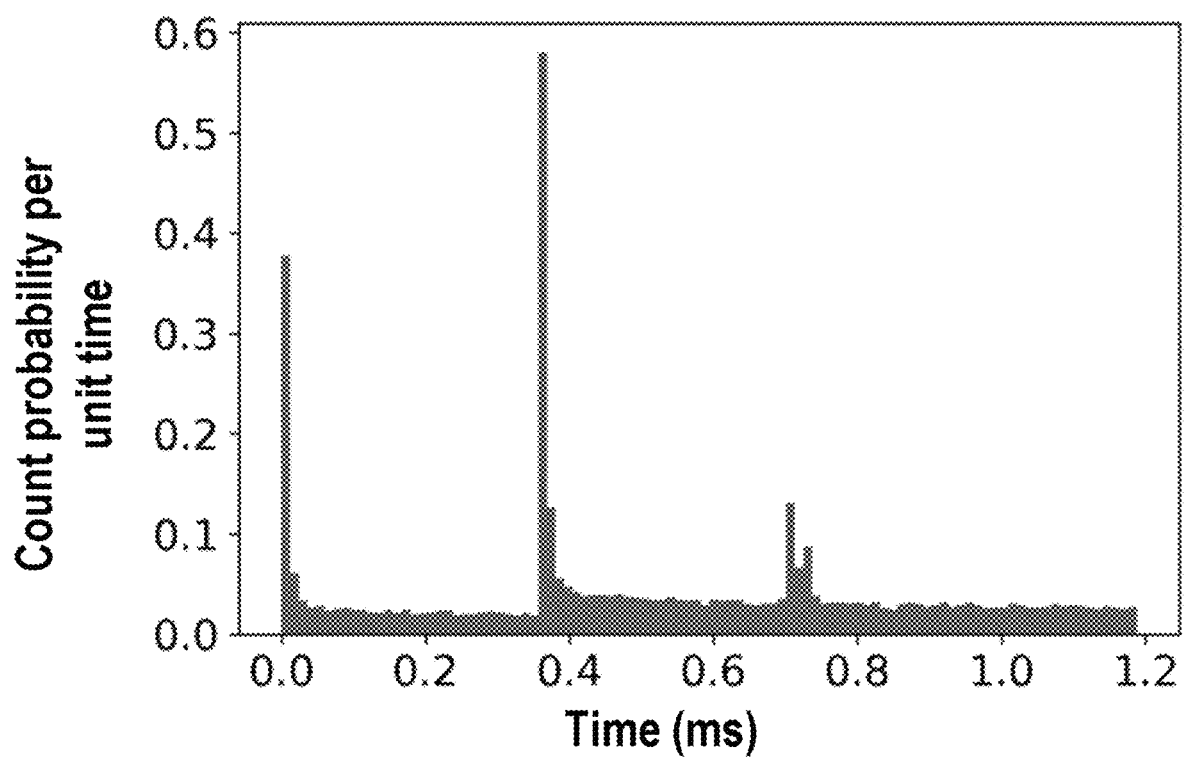

The detection of spins via the echo method detected by photon counting has been graphed in FIG. 4b, which shows the probability of counting one photon per unit time, said probability being obtained by averaging over a number of acquisition sequences. The two microwave pulses intended to generate the echo signal may be seen at the times t=0 and t=0.35 ms. The spin-echo is detected at the time t=0.7 ms, as expected. The amplitude of the signal is about 0.3 counts per echo sequence, which is close to the expected theoretical value of 0.4 counts on average.

The invention has been described with reference to its application to the detection of electronic spins, and more particularly to EPR spectroscopy (EPR standing for Electron Paramagnetic Resonance), but it is not limited thereto. In particular, it may be applied to the detection of nuclear spins and more particularly to NMR spectroscopy (NMR standing for Nuclear Magnetic Resonance). This is important, because while few molecular species have unpaired electrons detectable by EPR, very many nuclei—and in particular the most common thereof, the proton—have nuclear spin and are therefore detectable by NMR.

Extension of the technique of the invention to the detection of nuclear spins poses no difficulty in principle. However, since the gyromagnetic ratios of atomic nuclei are about three orders of magnitude lower than the gyromagnetic ratio of the electron, the Larmor frequencies used in NMR are typically much lower than those encountered in EPR (a few MHz or tens of MHz, instead of several GHz), despite the use of stronger magnetic fields. This has two consequences:

Firstly, it is necessary to count radio-frequency photons, which are less energetic than the microwave photons emitted by electron spins.

Secondly, the condition $$T_0 \leq \frac{\hbar\omega_0}{k_B},$$

which must preferentially be met to obtain a high sensitivity, requires even greater cooling.

This makes application of the invention to the detection of nuclear spins more complex, but not fundamentally so.

BIBLIOGRAPHY (McCoy 1989) "Nuclear spin noise at room temperature", M. A. McCoy and R. R. Ernst, Chemical Physics Letters 159, 587 (1989).

(Kubo 2012) "Electron spin resonance detected by a superconducting qubit", Y. Kubo et al. Phys. Rev. B 86, 06514 (2012)

(Bienfait 2016) "Reaching the quantum limit of sensitivity in electron spin resonance" A. Bienfait, J. J. Pla, Y. Kubo, M. Stern, X. Zhou, C. C. Lo, C. D. Weis, T. Schenkel, M. L. W. Thewalt, D. Vion, D. Esteve, B. Julsgaard, K. Moelmer, J J L Morton, P. Bertet, Nature Nanotechnology 11, 253 (2016).

(Probst 2017) "Inductive-detection electron-spin resonance spectroscopy with 65 spins/√Hz sensitivity" S. Probst, A. Bienfait, P. Campagne-Ibarcq, J. J. Pla, B. Albanese, J. F.

Da Silva Barbosa, T. Schenkel, D. Vion, D. Esteve, K. Moelmer, J. J. L. Morton, R. Heeres, P. Bertet, Appl. Phys. Lett. 111, 202604 (2017).

(Walsh 2017) "Graphene-Based Josephson-Junction Single-Photon Detector" Walsh, Evan D., et al. Physical Review Applied, vol. 8, no. 2, August 2017.

(Lescanne 2019) "Detecting itinerant microwave photons with engineered non-linear dissipation" R. Lescanne, S. Deléglise, E. Albertinale, U. Réglade, T. Capelle, E. Ivanov, T. Jacqmin, Z. Leghtas, E. Flurin, arxiv:1902:05102.

(Ranjan 2020) "Pulsed electron spin resonance spectroscopy in the Purcell regime" V. Ranjan, S. Probst, B. Albanes, A. Doll, O. Jacquit, E. Flurin, R. Heeres, D. Vion, D. Esteve, J. J. M. Morton, P. Bertet, J. Mag. Res. 310 (2020).

The invention claimed is:

1. A spin-detection method comprising the following steps:
   a) placing a sample (E) containing spins (SE) in a static magnetic field ($B_0$);
   b) magnetically coupling the sample to an electromagnetic resonator (REM) having a resonant frequency $\omega_0/2\pi$ equal to the Larmor frequency of the spins in the static magnetic field, the coupling constant and the quality factor of the resonator being sufficiently high for the coupling to the resonator to dominate the dynamics of relaxation of the spins;
   c) exciting the spins of the sample by means of a radio-frequency or microwave electromagnetic pulse (IS) at said Larmor frequency; and
   d) detecting an electromagnetic signal (RS') emitted by the spins of the sample in a mode of the electromagnetic resonator in response to said pulse by means of a device (CP) for counting radio-frequency or microwave photons;
   wherein the radio-frequency or microwave electromagnetic pulse at the Larmor frequency is a spin-flipping pulse, whereby the detected signal is a noise signal produced by the return of the spins to equilibrium.

2. The method as claimed in claim 1, wherein the device for counting radio-frequency or microwave photons is spaced apart from the electromagnetic resonator and connected thereto via a waveguide or a transmission line (LT).

3. The method as claimed in claim 1, wherein, at least in steps c) and d), the sample is kept at a temperature lower, preferably by at least a factor of 10, than $$T_0 = \frac{\hbar\omega_0}{k_B}$$

where h is the reduced Planck constant and $k_B$ is Boltzmann's constant.

4. The method as claimed in claim 1, wherein, in step d), the electromagnetic signal is detected during an acquisition window of duration comprised between $0.5 \cdot \Gamma_1^{-1}$ and $10 \cdot \Gamma_1^{-1}$, and preferably between $\Gamma_1^{-1}$ and $5 \cdot \Gamma_1^{-1}$, where $\Gamma_1$ is the relaxation rate of the spins of the sample coupled to the electromagnetic resonator.

5. The method as claimed in claim 1, wherein the coupling constant g between the spins of the sample and the electromagnetic resonator, the quality factor of the electromagnetic resonator at the Larmor frequency and the decoherence rate $\Gamma_2^*$ of the spins of the sample are chosen such that $$\frac{\Gamma_P}{\Gamma_2^*} < 1$$

and preferably $$\frac{\Gamma_P}{\Gamma_2^*} < 0.1,$$

where $$\Gamma_P = \frac{4Qg^2}{\omega_0}.$$

6. The method as claimed in claim 1, wherein the spin-flipping pulse is a spin-inverting pulse.

7. The method as claimed in claim 1, wherein the device for counting radio-frequency or microwave photons is a qubit.

8. The method as claimed in claim 6, wherein the device for counting radio-frequency or microwave photons is a transmon.

9. The method as claimed in claim 1, wherein the spins of the sample are electron spins.

* * * * *

UNITED STATES PATENT AND TRADEMARK OFFICE
CERTIFICATE OF CORRECTION

| | |
|---|---|
| PATENT NO. | : 12,105,037 B2 |
| APPLICATION NO. | : 17/801215 |
| DATED | : October 1, 2024 |
| INVENTOR(S) | : Patrice Bertet et al. |

It is certified that error appears in the above-identified patent and that said Letters Patent is hereby corrected as shown below:

In the Claims

In Claim 3, Column 10, Line 5, "where h is the reduced Planck" should be -- where $\hbar$ is the reduced Planck --.

Signed and Sealed this
Fifth Day of November, 2024

Katherine Kelly Vidal
*Director of the United States Patent and Trademark Office*